United States Patent

[11] 3,604,986

[72] Inventors Martin Paul Lepselter
New Providence;
Alfred Urquhart MacRae, Berkeley
Heights, both of, N.J.
[21] Appl. No. 20,308
[22] Filed Mar. 17, 1970
[45] Patented Sept. 14, 1971
[73] Assignee Bell Telephone Laboratories Incorporated
Murray Hill, N.J.

[54] HIGH FREQUENCY TRANSISTORS WITH SHALLOW EMITTERS
9 Claims, 5 Drawing Figs.

[52] U.S. Cl. .......... 317/235, 29/576, 317/234
[51] Int. Cl. .......... H01l 11/06
[50] Field of Search .......... 317/235, 234 U

[56] References Cited
UNITED STATES PATENTS

| | | | |
|---|---|---|---|
| 3,390,019 | 6/1968 | Manchester | 148/1.5 |
| 3,458,778 | 7/1969 | Gingabella et al. | 317/234 |
| 3,472,712 | 10/1969 | Bower | 148/187 |
| 3,478,415 | 11/1969 | Selman | 29/497.5 |

*Primary Examiner*—James D. Kallam
*Attorneys*—R. J. Guenther and Arthur J. Torsiglieri

ABSTRACT: It has been recognized that a Pt-Si contact forms without the usual concentration of minority carrier recombination sites. Thus, as applied to emitter regions, the contact appears to be an extension of the semiconductor. This allows the emitter region to be very shallow leading to better control of the base width. Methods for fabrication taking advantage of ion implantation techniques for forming very shallow, sharp emitter profiles are also described.

Figure 1:
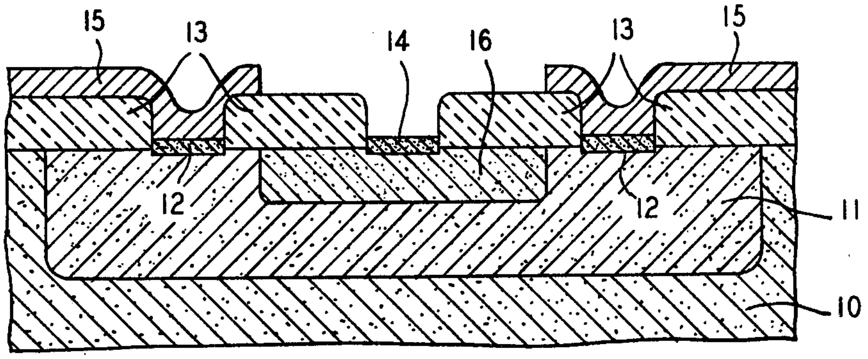

INVENTORS M. P. LEPSELTER
A. U. MAC RAE
BY
ATTORNEY

HIGH FREQUENCY TRANSISTORS WITH SHALLOW EMITTERS

This invention relates to high frequency silicon transistor structures.

Various methods have been devised for minimizing the base width of transistors to produce high frequency response. In practice these often involve techniques for control of the base and emitter diffusion steps. Errors in these steps can be cumulative on the base width and can even be disproportionate if the emitter depth exceeds the desired base width. For example, in diffusing an emitter 0.5$\mu$ into a 0.6$\mu$ base layer to produce a base width of 1,000 A., a 10 percent error in just one of the diffusion processes gives a 50 percent error in the base width.

Better control over the base width should be obtainable if the emitter depth is made shallow. However, in normal transistor structures if the emitter is made very shallow, i.e., less than 1,000 A., recombination at the contacts occurs and a decreased emitter efficiency is obtained.

It has now been recognized that the interface between certain metal alloy contacts and the semiconductor substrate is of such quality that the recombination probability for injected carriers at the interface is essentially the same as that in the bulk material. Thus the metal alloy contact appears to minority carriers as an extension of the bulk semiconductor, i.e., the emitter. As a consequence of this recognition, the emitter can be made very shallow, e.g., 50 A. to 1,000 A., thus allowing precise control over the overall transistor structure. The base width can now be essentially controlled by the base diffusion step and base widths of the order of 100 A. to 1,000 A. can be reliably and reproducibly obtained.

The metal alloy contacts which permit the results alluded to above are the silicides of nickel, titanium, zirconium, hafnium, and the six platinum group metals. These metals form various silicide compounds which are effective for the purposes described herein.

These and other aspects of the invention are described more explicitly in the following detailed description. In the drawing:

FIG. 1 is a front elevation in section of a transistor constructed in accordance with the invention; and FIGS. 2A, 2B, 3A and 3B are impurity profiles at a semiconductor surface demonstrating various aspects of the invention.

Referring to FIG. 1, the transistor shown comprises an $n$-type collector region 10 and a $p$-type base region 11. The base region is formed by any appropriate technique, usually by doping using ion implantation or a conventional diffusion process. Metal contact 12 is made to the base region through an oxide mask 13 as shown. The contact is a two-stripe ohmic contact consisting, for example, of platinum silicide. Emitter contact 14, also of platinum silicide, can be formed in the same operation. Overlay contact 15 is then made to the base contact as shown. The overlay may consist for example of A1 or other suitable conductor such as a standard beam lead. The $n$ -type emitter region 16 can now be formed by ion implantation using the overlay contact or the oxide layer as a mask or by diffusion using the oxide layer as a mask. The former alternative is illustrated in FIG. 1. Using known diffusion techniques, an $n$-type impurity such as arsenic is diffused through the metal silicide contact 14. Alternatively the emitter region can be diffused prior to the formation of the metal silicide contact according to well-established techniques. An appropriate conventional diffusion process is described in U.S. Pat. No. 3,006,052 issued Nov. 27, 1962, to B.T. Howard. It may be convenient to codeposit the impurity with the platinum by, for example, sputtering the platinum through an ambient containing the impurity and heating to simultaneously diffuse the impurity and form the platinum silicide. This approach may follow the procedure set forth in detail in patent application of P. A. Byrnes, Jr. and M. P. Lepselter, Ser. No. 848,935 and filed Aug. 11, 1969, with the addition of a few percent of an appropriate impurity to the deposited contact.

Figure 2A:
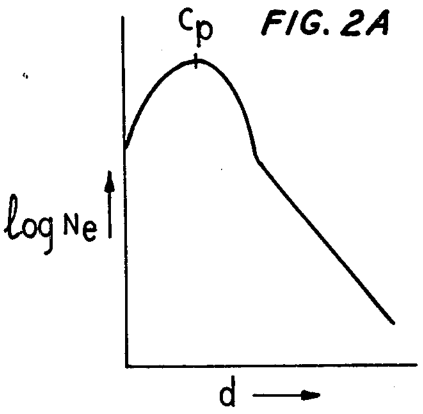
Figure 2B:
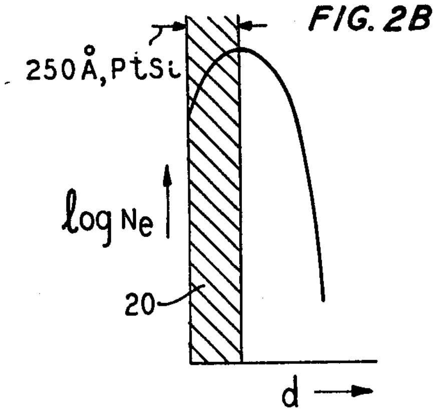

According to another embodiment, the emitter is formed by ion implantation. The technique of implanting the emitter through the metal silicide contact has distinct advantages. These will be described in connection with FIGS. 2A and 2B, which are impurity profiles at a silicon surface. FIG. 2A is a profile for an arbitrarily chosen impurity into a base silicon surface. The ordinate designates increasing impurity concentration, $N_e$, while the abscissa is increasing depth, $d$, from the surface (origin). This profile is characteristic of, for example, phosphorous implanted into a $p$-type silicon at 25 kev. In this particular case the peak concentration, $C_p$, occurs at approximately 350 A. and the overall effective emitter depth is 500 A. The profile is predictable except for the anomalous tail indicated. The inordinate concentration of deep impurities may be due to channeling or to some unknown diffusion mechanism, but the practical effect is a degradation of the transistor. However, when the emitter is implanted through a metal layer by the technique described below, the tail does not appear or is minimized. This is illustrated by the profile of FIG. 2B. The emitter cam be made shallow by selecting the thickness of the metal layer 20 and the ion energy so that the concentration peak occurs at or near the surface of the silicon. For example, the profile of FIG. 2B is obtained when phosphorous is implanted through 250 A. of Pt-Si at an energy of 50 kev. The peak concentration occurs at 250 A. (the interface) with an overall emitter depth of 150 A. This emitter profile is sharp and considerably shallower than the emitter implanted directly into the silicon.

Figure 3A:
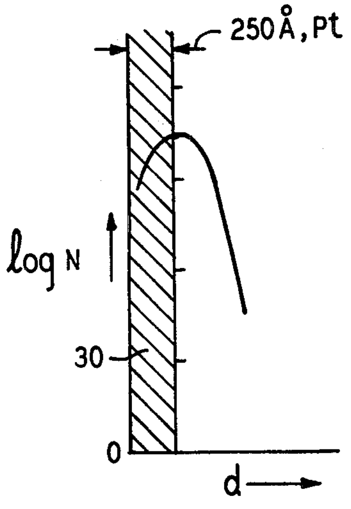
Figure 3B:
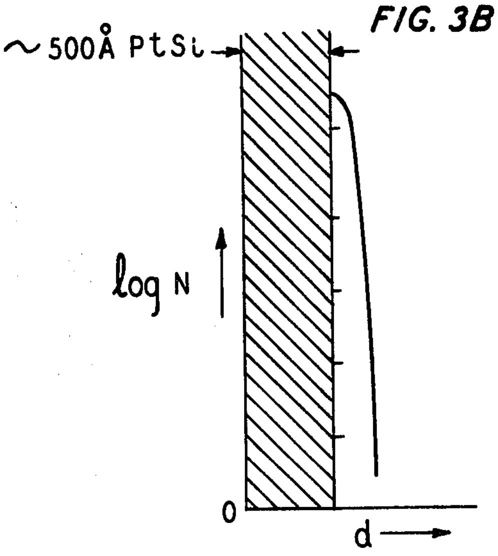

Further improvement in the emitter profile can be obtained following the general technique described above but with a slight modification of the processing sequence. This is described in connection with FIGS. 3A, and 3B. FIG. 3A shows a layer 30, 250 A. thick of silicide-forming metal such as platinum, deposited on the silicon substrate but as yet unreacted. The impurity, in this case phosphorus is implanted at 75 kev. through the metal layer giving the impurity profile shown. The peak impurity concentration again occurs at the interface, (250 A.), with an effective emitter depth in this case of 200A. The impurity concentration at the interface is $>10^{19}$/cc. The silicon is then heated to 700° C. for 5 min. to form the metal silicide. The effect of this is to concentrate the impurities at the silicide-silicon interface. The resulting impurity profile is shown in FIG. 3B and is exceptionally sharp and shallow. The temperature of formation of the alloy is insufficient for significant thermal diffusion of the impurity into the silicon. Similar results are obtained with NiSi and the other silicide-forming metals described previously.

To obtain the advantages of the shallow emitter formed by ion implantation described in connection with FIGS. 2A and 2B it is not essential that the contact be a metal silicide although this is a preferred structure. Useful results are obtained with, e.g., 250 A. gold contacts.

What is claimed is:

1. A high frequency silicon transistor comprising a silicon substrate having collector, base and emitter regions, the base region having a width of less than 1,000 A. and the emitter region having a depth of less than 1,000 A. and electrical contacts to each of said regions, the emitter contact comprising a metal silicide formed in situ in contact with the emitter region.

2. The transistor of claim 1 in which the metal component of the silicide is selected from the group consisting of nickel, titanium, zirconium, hafnium, and the six platinum group metals.

3. A method for making a high frequency silicon transistor comprising forming within a silicon substrate collector, base and emitter regions, the base region having a width of less than 1,000 A. and the emitter region having a depth of less than 1,000 A. and forming electrical contacts with each region, forming the emitter contact including depositing on the surface of the emitter region a metal layer selected from the group consisting of nickel, titanium, zirconium, hafnium, and the six platinum group metals and heating the metal layer to form a metal silicide contact.

4. A method according to claim 3 in which forming the emitter region includes codepositing of the silicon substrate the said metal along with the impurity for forming the emitter region and heating the codeposited layer to diffuse the emitter region while simultaneously forming the metal silicide contact.

5. The method of claim 4 in which the metal is platinum codeposited with a small amount of arsenic.

6. The method of claim 3 in which the impurity forming the emitter region is deposited in the surface of the substrate prior to deposition of the metal layer so that diffusion is enhanced during formation of the metal silicide contact.

7. The method of claim 5 in which the codeposited layer is heated to approximately 700° C. to diffuse the emitter and form the metal silicide.

8. A method according to claim 3 in which forming the emitter includes diffusing a conductivity type determining impurity through the said metal layer prior to the formation of the metal silicide.

9. The method of claim 3 in which forming the emitter region includes implantations of the conductivity-type determining impurity therein through the metal layer prior to the formation of the metal silicide.